US012596309B2

(12) United States Patent
Rabe

(10) Patent No.: US 12,596,309 B2
(45) Date of Patent: Apr. 7, 2026

(54) SUPPORT FOR AN OPTICAL ELEMENT

(71) Applicant: Carl Zeiss SMT GmbH, Oberkochen (DE)

(72) Inventor: Rodolfo Guglielmi Rabe, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 115 days.

(21) Appl. No.: 18/418,734

(22) Filed: Jan. 22, 2024

(65) Prior Publication Data

US 2024/0159988 A1    May 16, 2024

Related U.S. Application Data

(63) Continuation of application No. PCT/EP2022/072186, filed on Aug. 8, 2022.

(30) Foreign Application Priority Data

Aug. 9, 2021    (DE) ..................... 10 2021 208 628.4

(51) Int. Cl.
*G03F 7/00*        (2006.01)
(52) U.S. Cl.
CPC ...... *G03F 7/70891* (2013.01); *G03F 7/70825* (2013.01); *G03F 7/70833* (2013.01); *G03F 7/7095* (2013.01)
(58) Field of Classification Search
CPC ............. G03F 7/70108; G03F 7/70233; G03F 7/70825; G03F 7/70891; G03F 7/70066; G03F 7/70075; G03F 7/702; G03F 7/7015; G03F 7/70158; G03F 7/70166; G03F 7/70175; G03F 7/70183; G03F 7/70141; G03F 7/70225; G03F 7/70241; G03F 7/70258; G03F 7/70266; G03F 7/70308; G03F 7/70316; G03F 7/70191; G03F 7/708; G03F 7/70808; G03F 7/70816; G03F 7/70833; G03F 7/70841; G03F 7/7085; G03F 7/70858; G03F 7/70883;

(Continued)

(56) References Cited

U.S. PATENT DOCUMENTS 6,259,571 B1 * 7/2001 Holderer ................ G02B 7/026
359/822
6,573,978 B1    6/2003 McGuire, Jr.
(Continued)

FOREIGN PATENT DOCUMENTS

DE    10 2006 060 088 A1    6/2008
DE    10 2008 009 600 A1    8/2009
(Continued)

OTHER PUBLICATIONS

German Office Action, with translation thereof, for corresponding DE Appl No. 10 2021 208 628.4, dated Jan. 20, 2022.

(Continued)

*Primary Examiner* — Christina A Riddle
(74) *Attorney, Agent, or Firm* — Fish & Richardson P.C.

(57) ABSTRACT

A connection arrangement for connecting a first component and a second component of an imaging device for micro lithography, such as for using light in the extreme UV range (EUV), includes a connection unit having a first contact portion, a second contact portion and a coupling portion.

20 Claims, 3 Drawing Sheets

(58) Field of Classification Search

CPC ............. G03F 7/70908; G03F 7/70941; G03F 7/7095; G03F 7/70958; G03F 7/70975; G03F 7/70991; G03F 7/70033; G02B 17/0663; G02B 27/18; G02B 7/026; G02B 7/028; G02B 7/181; G02B 17/06; G02B 26/0833; G02B 26/101; Y10T 428/3154

USPC ..... 355/18, 30, 52–55, 66–77; 359/811–830, 359/859–883

See application file for complete search history.

(56) References Cited

U.S. PATENT DOCUMENTS

| | | | |
|---|---|---|---|
| 2005/0046815 A1 | 3/2005 | Ebinuma et al. | |
| 2006/0132747 A1 | 6/2006 | Singer et al. | |
| 2008/0204689 A1* | 8/2008 | Heintel | G03F 7/70825 |
| | | | 359/820 |
| 2008/0291555 A1* | 11/2008 | Okada | G02B 7/028 |
| | | | 359/820 |
| 2011/0096314 A1 | 4/2011 | Sato | |
| 2018/0074303 A1 | 3/2018 | Schwab | |

FOREIGN PATENT DOCUMENTS

| | | |
|---|---|---|
| DE | 10 2013 201 264 A1 | 2/2014 |
| DE | 10 2018 124 483 B3 | 12/2018 |
| EP | 1 614 008 B1 | 12/2009 |
| WO | WO 2009/150178 A1 | 12/2009 |

OTHER PUBLICATIONS

Translation of International Search Report for corresponding PCT Appln No. PCT/EP2022/072186, dated Dec. 9, 2022.

Translation of International Preliminary Report on Patentability for corresponding PCT Appln No. PCT/EP2022/072186, dated Feb. 22, 2024.

* cited by examiner

SUPPORT FOR AN OPTICAL ELEMENT

CROSS-REFERENCE TO RELATED APPLICATIONS

The present application is a continuation of, and claims benefit under 35 USC 120 to, international application PCT/EP2022/072186, filed Aug. 8, 2022, which claims benefit under 35 USC 119 of German Application No. 10 2021 208 628.4, filed Aug. 9, 2021. The entire disclosure of each these applications is incorporated by reference herein.

FIELD

The present disclosure relates to a connection arrangement for connecting components of a microlithographic imaging device suitable for the use of used UV light, such as light in the extreme ultraviolet (EUV) range. Furthermore, the disclosure relates to an optical imaging device comprising such a connection arrangement. The disclosure can be used in conjunction with any desired optical imaging methods. It can be used in the production or the inspection of microelectronic circuits and the optical components used for them (for example optical masks).

BACKGROUND

The optical devices used in conjunction with the production of microelectronic circuits typically comprise a plurality of optical element units comprising one or more optical elements, such as lens elements, mirrors or optical gratings, which are arranged in the imaging light path. The optical elements typically cooperate in an imaging process in order to transfer an image of an object (for example a pattern formed on a mask) to a substrate (for example a so-called wafer). The optical elements are typically combined in one or more functional groups, which are optionally held in separate imaging units. In particular in the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically comprise a support structure having a substantially ring-shaped outer support unit, which supports one or more optical element holders, which in turn hold the optical element.

The ever-advancing miniaturization of semiconductor components results in a constant demand for increased resolution of the optical systems used for their production. This demand for increased resolution involves the demand for an increased numerical aperture (NA) and an increased imaging accuracy of the optical systems.

One approach for obtaining an increased optical resolution is to reduce the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In this EUV range, it is no longer possible to use conventional refractive optical systems. This is owing to the fact that in this EUV range the materials used for refractive optical systems generally have an absorbance that is too high to achieve acceptable imaging results with the available light power. Consequently, this EUV range generally involves the use reflective optical systems for imaging.

This transition to purely reflective optical systems with a high numerical aperture (e.g., NA>0.4) in the EUV range can result in considerable challenges with regard to the design of the imaging device.

The factors mentioned above can result in very stringent desired properties with regard to the position and/or orientation relative to one another of the optical elements participating in the imaging and also with regard to the deformation of the individual optical elements in order to achieve a desired imaging accuracy. Moreover, it is generally desirable to maintain this high imaging accuracy over operation in its entirety, ultimately over the lifetime of the system.

As a consequence, it is generally desirable for the components of the optical imaging device (i.e., for example, the optical elements of the illumination device, the mask, the optical elements of the projection device, and the substrate) which cooperate during imaging to be supported in a well-defined manner in order to maintain a given well-defined spatial relationship between these components and obtain a minimal undesired deformation of these components, in order ultimately to achieve the highest possible imaging quality.

Undesirable thermally induced deformations can result from different coefficients of thermal expansion of the individual components in the imaging device. These undesirable thermally induced deformations are usually caused by the energy input from the imaging light, which may not be able to be fully compensated by cooling systems. The optical elements used are typically produced from materials here which have a particularly low coefficient of thermal expansion in order to keep the influence of the energy input on the geometry of the optical element as low as possible. The interfaces of the optical element to the adjacent support structure are typically an issue here, since the support structure, in particular its components in the region of the interfaces to the optical element are generally not produced, or at least not economically viably, from materials with a comparably low coefficient of thermal expansion.

Compensation elements which by way of elastic deformation absorb such thermally induced different expansions, as is known for example from US 2005/046815 A1 (Ebinuma et al., the entire disclosure of which is incorporated by reference here), are typically provided in the region of the interfaces of the optical element to the adjacent support structure. Here, however, elastic restoring forces might still be introduced into the optical element, and these can lead to undesirable parasitic stresses and resulting deformations.

SUMMARY

The disclosure seeks to provide a connection arrangement for connecting components of a microlithographic imaging device and a corresponding optical imaging device having such an arrangement, a method for connecting components of an imaging device, and an optical imaging method, which, for example, easily at least reduce an unwanted thermally induced parasitic deformation of components of the imaging device.

The disclosure involves the technical teaching that an undesirable thermally induced parasitic deformation of components of the imaging device can easily be at least reduced, possibly even completely avoided if the two components are connected via a connection arrangement having two contact portions and an intermediate coupling portion, such that a thermally induced change in the distance between the two ends of the coupling portion brings about a compensation movement between the two contact portions which runs transversely thereto and which at least partially compensates for a thermally induced change in distance between the coupled components in the region of the contact portions.

What can be achieved in the process in a simple manner in particular is that the contact force between the respective contact portion and the contacted component has a predeterminable profile in the case of a (positive or negative) thermal expansion. In the process, the respective contact force can be kept almost constant within certain tolerances, just as it also is possible to obtain defined contact force curves. For example, it may thus be possible to provide a certain increase or reduction in the respective contact force between different thermal states.

The compensation movement between the two contact portions can be achieved by a deformation of the coupling portion resulting from the change in distance between the two ends of the coupling portion. In this case, the compensation movement can be easily defined by the geometry and the material properties of the coupling portion. For example, the inherent thermal expansion of the coupling portion can be used as an influencing factor. Naturally, the deformation of the coupling portion resulting from the contact forces can likewise also be used or taken into account as an influencing factor.

According to one aspect, the disclosure therefore relates to a connection arrangement for connecting a first component and a second component of a microlithographic imaging device, such as for the use of light in the extreme UV (EUV) range, via a connection unit having a first contact portion, a second contact portion, and a coupling portion. The first contact portion is configured to contact the first component in an assembled state, while the second contact portion is configured to contact the second component in the assembled state. The first contact portion comprises a first coupling region and a second coupling region, which is at a coupling region distance from the first coupling region in a first direction. The coupling portion has a first end and an opposite second end, wherein the coupling portion, at least in the assembled state, couples together the first contact portion and the second contact portion by virtue of the first end of the coupling portion being connected to the first coupling region and the second end of the coupling portion being connected to the second coupling region. The coupling portion, at least in the assembled state, is connected between the first end and the second end to the second contact portion. The first contact portion and/or the coupling portion is furthermore designed in such a way that, in the assembled state in the case of a change in state, caused by thermal expansion in particular, from a first state to a second state with an increase in the coupling region distance, a movement component along a second direction is impressed upon the second contact portion, with the second direction running across the first direction.

In general, the connection unit and the first and second component can be arranged in any suitable manner to each other in order to obtain the desired connection. In particularly simple and advantageous variants, the connection unit is designed, in the assembled state, to be arranged in an intermediate space between the first component and the second component, wherein the first component in particular can have a greater coefficient of thermal expansion than the second component.

In this case, it may be the case that the intermediate space reduces when the state changes from the first state to a second state and the movement component of the second contact portion in the second direction points at the first component in order to obtain the desired compensation movement. Particularly advantageous and compact designs result when the first component is located in a recess in the second component.

Alternatively, the intermediate space may increase when the state changes from the first state to a second state and the movement component of the second contact portion counter to the second direction may then point away from the first component in order to achieve the desired compensation movement. Here, too, particularly advantageous and compact designs result in turn when the second component is located in a recess in the first component.

In general, the coupling portion can be designed in a desired manner suitable for achieving the described compensation movement. For example, the coupling portion may thus have a three-dimensionally curved and/or kinked profile, which is stretched when the coupling region distance is increased in order to achieve the compensation movement. Naturally, any desirably complex three-dimensional expansion profiles of the two coupled components can then likewise be taken into account in this context. Particularly simple and yet effective designs result when the coupling portion has a curved and/or kinked profile (consequently has this profile thus in a plane).

In some variants, the coupling portion defines a center axis between the first end and the second end, wherein the center axis of the coupling portion, at least in the first state, has an arcuate, first profile between the first end and the second end. The center axis of the coupling portion, in the second state in which the increase in the coupling region distance is present, then has a second profile, which is stretched vis-à-vis the first profile, between the first end and the second end. This stretching then achieves the desired compensation movement in a simple way.

In this context, a simple case may for example provide for the second profile to be arcuate or at least substantially straight. Likewise, the first profile can be at least one of at least partially curved and at least partially polygonal. In certain variants, the second profile is at least one of at least partially curved and at least partially polygonal. In certain variants, provision can furthermore be made for the center axis of the coupling portion between the first end and the second end to define a first mean curvature in the first state and a second mean curvature in the second state, wherein the second mean curvature is less than the first mean curvature, wherein the second mean curvature is in particular 95% to 0%, such as 75% to 5%, for example 50% to 10%, of the first mean curvature. The desired compensation movement can be achieved in a particularly simple and compact way in all these cases either on an individual basis or in any combination.

As already explained above, in general desirably force curves can be obtained between the (thermal) first and second states for the contact forces relating to the two components. In certain advantageous variants, the second contact portion, in the first state, exerts a first contact force on the second component, while the second contact portion, in the second state, exerts a second contact force on the second component. In this case, the first contact portion and/or the coupling portion can be designed in such a way that the second contact force is 80% to 120%, such as 90% to 110%, for example 95% to 105%, of the first contact force. In addition or an alternative, the first contact portion and/or the coupling portion can be designed in such a way that, during the transition from the first state to the second state, the contact force exerted by the second contact portion on the second component varies at most by 15% to 20%, such as by no more than 5% to 10%, for example by no more than 1% to 3%, of the first contact force. Particularly advantageous contact force curves are achieved respectively on an individual basis or in combination as a result.

In general, the connection unit can be designed as an unalterably preset unit. In particularly advantageous variants, the connection unit may comprise at least one adjustment device for setting the first contact force. The adjustment can be made here in particular by changing the coupling region distance.

In certain variants of the connection arrangement, the first contact portion can be designed in such a way that, when the state changes from the first state to the second state, a coupling region displacement away from the first component counter to the second direction is impressed upon the first coupling region and the second coupling region. In this context, the coupling portion is designed to impress a contact portion displacement upon the second contact portion when the state changes from the first state to the second state, wherein the contact portion displacement in the second direction is implemented toward the first component and at least substantially compensates for the effect of the coupling region displacement. A particularly advantageous configuration can be achieved in this way, in which the compensation movement also compensates for the inherent thermally induced displacement of the coupling portion.

In general, the first contact portion can be designed in any suitable manner for as long as there is sufficient free space between the first contact portion and the coupling portion that the coupling portion can perform the compensation movement. Thus, for example, the first contact portion may be designed to be contiguous in such a way that the first coupling region and the second coupling region are formed by a single common segment of the connection unit, which is then separated from the coupling portion by an appropriate intermediate space, for example a gap.

In certain advantageous variants, the first contact portion comprises a first contact segment and a second contact segment which, in the assembled state, each contact the first component by way of a component contact surface. In this case, the first contact segment and the second contact segment are spaced apart from one another to form a free space, in particular along the first direction, wherein the first contact segment forms the first coupling region and the second contact segment forms the second coupling region and the coupling portion, in the assembled state, bridges the free space, in particular in arcuate fashion. This allows a particularly advantageous configuration to be obtained, since the two separate contact segments can easily follow thermally induced relative movements with respect to one another.

Provision can be made for the component contact surface of the first contact segment to be spaced apart from the first coupling region, in particular in the second direction. In addition or an alternative, the component contact surface of the second contact segment can be spaced apart from the second coupling region, in particular in the second direction. This distance can in each case advantageously influence the overall displacement between the first and second contact portion because the thermally induced displacement of the coupling portion with respect to the first component increases as this distance increases. In the case of a given compensation movement by the coupling portion, it is then possible to adjust the distance accordingly thereto, in order to obtain a given overall displacement between the first and second contact portion.

In certain variants, provision may be made for the first contact segment, the second contact segment, and the coupling portion to form at least a part of a connection element, which may optionally also furthermore comprise the second contact portion. As a result, a particularly compact and easy-to-use configuration can be obtained. In this case, the connection element may have a monolithic embodiment, whereby a simple configuration which advantageously maintains tight tolerances may be achieved.

In general, it may be sufficient for the connection arrangement to comprise only one such connection element. In advantageous variants, however, the connection element is a first connection element, while the connection unit comprises at least one additional connection element. In this case, the connection unit may comprise N additional connection elements, where N has the value of 1 to 5, such as 2 to 4, for example 2 to 3. What is true here in general is that a greater number of connection elements enables a finer or more evenly distributed transfer of the loads between the first and second components.

In general, the first connection element and the at least one additional connection element can be designed differently, for example to account for certain uneven distributions of the loads to be transferred between the first and second component. Certain, particularly simple variants may provide for the at least one additional connection element to be designed to be at least substantially identical to the first connection element.

In the assembled state, the first connection element and the at least one additional connection element can be arranged separately from one another. In particularly compact and easy-to-assemble variants, at least one contact segment of the first connection element, at least in the assembled state, contacts a contact segment of the at least one additional connection element. Furthermore, at least one contact segment of the first connection element and one contact segment of the at least one additional connection element can be formed together in monolithic fashion, whereby in particular the handling and assembly is simplified.

In general, the connection unit can have any desired design depending on the design of the components to be connected. For example, it may thus have a generally linear or arcuate profile. In certain variants, the connection unit is of ring-shaped design. Furthermore, the connection unit for example can contact an outer circumference of the first component, wherein the connection unit can then surround a portion of the first component in ring-shaped fashion. Likewise, the connection unit can contact a wall of a recess in the second component, wherein the connection unit can then be inserted into the recess in the second component. Particularly advantageous, compact configurations are achieved in all these cases.

In further variants of the connection arrangement, the first contact portion may comprise a contact segment which, in the assembled state, contacts the first component by way of a component contact surface. In these variants, the contact segment forms the first coupling region and the second coupling region away from the component contact surface, wherein the coupling portion, in the assembled state, bridges an intermediate space between the first coupling region and the second coupling region, in particular in arcuate fashion. As already explained above, all that needs to be provided in this context is a free space (for example a gap) between the contact segment and the coupling portion, which free space is sufficient for the coupling portion to be able to perform the compensation movement.

Here, too, provision can be made for the component contact surface of the contact segment to be spaced apart from the first coupling region and/or the second coupling region in the second direction. As already explained, this distance can in each case advantageously influence the overall displacement between the first and second contact portion because the thermally induced displacement of the coupling portion with respect to the first component increases as this distance increases. In the case of a given compensation movement by the coupling portion, it is then possible to adjust the distance accordingly thereto, in order to obtain a given overall displacement between the first and second contact portion.

In general, the contact segment can have any desired design. The contact segment can be designed to be substantially V-shaped or substantially Y-shaped or substantially T-shaped, since this allows particularly advantageous, in particular compact configurations to be achieved, in which the two coupling regions can simply be arranged at the free ends of the two limbs.

In certain variants, the contact segment and the coupling portion form at least a part of a connection element. In this case, the connection element may furthermore comprise the second contact portion. Likewise, the connection element may in turn have a monolithic embodiment, in order to achieve the advantages already mentioned above in this regard.

In these designs, too, the connection element may be a first connection element and the connection unit may comprise at least one additional connection element. In this case, the connection unit may comprise M additional connection elements, where M has the value of 1 to 99, such as 2 to 49, for example 2 to 24. Here, too, for the reasons already mentioned above, a different design of the connection elements may be provided, for example in order to take account of different load distributions. Likewise, the at least one additional connection element may be designed to be at least substantially identical to the first connection element.

Here, too, the connection elements of the connection unit can be arranged in turn as desired, as explained above. In particular, the connection elements of the connection unit may be arranged in ring-shaped fashion in order to use the aforementioned advantages of such an arrangement. In certain variants, the connection unit contacts a wall of a recess in the first component, wherein the connection unit can be inserted into the recess in the first component in particular. Likewise, the connection unit can contact an outer circumference of the second component, wherein the connection unit can surround a portion of the second component in particular in ring-shaped fashion. The advantages of such a configuration, already explained above, are also achieved herewith.

In respect of the materials used, the connection arrangement can be matched to the materials of the first and second component. In certain advantageous variants, the first component, at least in its region adjacent to the first contact portion, is constructed from a first material having a first coefficient of thermal expansion, while the second component, at least in its region adjacent to the second contact portion, is constructed from a second material having a second coefficient of thermal expansion. The connection unit is constructed from a third material having a third coefficient of thermal expansion, wherein the following can be realized on an individual basis or in any combination.

Thus, the first coefficient of thermal expansion can be greater than the second and the third coefficient of thermal expansion. Likewise, the second coefficient of thermal expansion can be greater than the third coefficient of thermal expansion. Furthermore, the second coefficient of thermal expansion can be 5% to 25%, such as 8% to 20%, for example 12% to 18%, of the first coefficient of thermal expansion. Likewise, the third coefficient of thermal expansion can be 5% to 50%, such as 10% to 40%, for example 20% to 30%, of the first coefficient of thermal expansion. In this case, the third coefficient of thermal expansion may be located at any suitable location in the interval between the first and second coefficient of thermal expansion. The difference between the first coefficient of thermal expansion and the third coefficient of thermal expansion can be 40% to 95%, such as 50% to 90%, for example 75% to 88%, of the difference between the first coefficient of thermal expansion and the second coefficient of thermal expansion.

However, it is understood that, in other variants, the third coefficient of thermal expansion may however also be located outside the interval between the first and second coefficient of thermal expansion. This may be advantageous for obtaining a certain overall displacement between the first and second component by way of the combination of the thermal expansion of the connection unit and the compensation movement.

The first coefficient of thermal expansion can be $10 \cdot 10^{-6} K^{-1}$ to $20 \cdot 10^{-6} K^{-1}$, such as $11 \cdot 10^{-6} K^{-1}$ to $17 \cdot 10^{-6} K^{-1}$, for example $13 \cdot 10^{-6} K^{-1}$ to $15 \cdot 10^{-6} K^{-1}$, while the second coefficient of thermal expansion can be $0.5 \cdot 10^{-6} K^{-1}$ to $4 \cdot 10^{-6} K^{-1}$, such as $1 \cdot 10^{-6} K^{-1}$ to $3 \cdot 10^{-6} K^{-1}$, for example $1 \cdot 10^{-6} K^{-1}$ to $2 \cdot 10^{-6} K^{-1}$, and the third coefficient of thermal expansion can be by $2 \cdot 10^{-6} K^{-1}$ to $6 \cdot 10^{-6} K^{-1}$, such as $2.5 \cdot 10^{-6} K^{-1}$ to $5 \cdot 10^{-6} K^{-1}$, for example $3 \cdot 10^{-6} K^{-1}$ to $4 \cdot 10^{-6} K^{-1}$.

In general, the connection unit can be secured relative to the first or second component in any appropriate manner. Thus, on an individual basis or in any combination in one or more degrees of freedom (up to all six degrees of freedom in space), a frictionally connected, an interlocking or an integrally bonded link may be provided. In certain advantageous variants, at least one of the contact portions comprises, in its region adjacent to the directly contacted component, a securing portion which is designed to secure, especially secure via a form fit, the contact portion and the directly contacted component in a third direction which runs across the first and the second direction. This allows particularly simple and compact configurations to be obtained which allow thermal expansion in a simple manner. In this context, it may be advantageous if in the third direction, the securing portion is arranged in a central region of the contact portion, since this renders possible an expansion to both sides, in which the local relative movements between the connection unit and the component to be absorbed overall are reduced or minimized.

In its region adjacent to the first component, the first contact portion may comprise a first securing portion in this case. In its region adjacent to the second component, the second contact portion may likewise comprise a second securing portion. Furthermore, the securing portion can be formed by at least one projection which extends in a plane perpendicular to the third direction and, in the assembled state, engages in an assigned recess in the directly contacted component. Finally, in the assembled state, the securing portion may also be formed by at least one adhesive bond, which is formed in the region of at least one depression in the contact portion.

In certain variants, at least one of the contact portions may comprise, in its region adjacent to the directly contacted component, a compensation portion. The compensation portion is designed to absorb, especially absorb via elastic deformation, a differing thermal expansion between the contact portion and the directly contacted component in a third direction which runs across the first and the second direction. This can advantageously reduce parasitic stresses that result from the different thermal expansion in a third direction.

In its region adjacent to the first component, the first contact portion may comprise a first compensation portion in this case. In its region adjacent to the second component, the second contact portion may likewise comprise a second compensation portion. Particularly simple and advantageous variants arise if the compensation portion is formed by elastic portions which are spaced apart from one another along the third direction and the resilience of which, such as along the third direction, increases along the third direction from a central portion of the contact portion to the ends of the contact portion. In this case, the elastic portions can be formed in particular by leaf-spring-like elements, the length of which increases toward the ends of the contact portion. In particularly simple variants, the different length of the leaf-spring-like elements can be defined simply by slots of different depths across the third direction in the contact portion. In this case, the depth of the slots can increase along the third direction from the central portion to the ends of the contact portion, in order to set the desired resilience. However, in addition or an alternative, the desired resilience may likewise also be set by way of the spacing of the slots or the thickness of the elastic portions defined thereby.

In general, the connection arrangement can be used to connect any desired components. The advantages specified herein particularly readily come to bear if the first component is a constituent part of a support structure, in particular for an optical element, constructed in particular from at least one of the materials steel, a metal with low thermal expansion, and a non-metal with low thermal expansion. In addition or an alternative, it is advantageous if the second component is an optical element constructed in particular from at least one of the materials ceramic, Zerodur, and ULE® glass. Optionally, the connection unit may be constructed from at least one of the materials tungsten, and a tungsten alloy.

In general, the connection unit can be designed and used in any manner appropriate for providing the compensation movement in a second direction matched to the first and second component. Particularly advantageous configurations arise if the first component defines an axial direction, a radial direction, and a circumferential direction, and the second direction runs at least substantially along the radial direction. In this case, the first direction can run at least substantially along the circumferential direction. Likewise, the first direction can however also run at least substantially along the axial direction.

In general, the second contact portion can be designed in any suitable way for obtaining the desired link to the second component. Particularly advantageous configurations arise when the second contact portion has a substantially T-shaped or mushroom-shaped cut contour in a plane defined by the first and second direction. In addition or an alternative, the second contact portion may have a narrow bridge-like portion, via which the second contact portion is connected to the coupling element, wherein a longitudinal axis of the bridge-like portion runs across the first and second direction.

The present disclosure also relates to an optical arrangement having an optical element which is connected to a support structure via a connection arrangement according to the disclosure. This makes it possible to realize the variants and advantages described above to the same extent, and so reference is made to the explanations given above in this respect in order to avoid repetitions.

The present disclosure also relates to an optical imaging device, in particular a microlithographic optical imaging device, comprising an illumination device having a first optical element group, an object device for receiving an object, a projection device having a second optical element group and an image device. The illumination device is designed to illuminate the object while the projection device is designed to project an image representation of the object onto the image device. In this case, the illumination device and/or the projection device comprises at least one optical arrangement according to the disclosure, as has been described above. This makes it possible to realize the variants and advantages described above to the same extent, and so reference is made to the explanations given above in this respect in order to avoid repetitions.

The present disclosure furthermore relates to a method for connecting a first component and a second component of a microlithographic imaging device, in particular for the use of light in the extreme UV (EUV) range, via a connection unit, wherein a first contact portion of the connection unit is brought into contact with the first component in an assembled state, and a second contact portion of the connection unit is brought into contact with the second component in the assembled state. A first coupling region of the first contact portion and a second coupling region of the first contact portion are arranged at a coupling region distance from one another in a first direction. The first contact portion and the second contact portion are coupled together, at least in the assembled state, via a coupling portion of the connection unit having a first end and an opposite second end, by virtue of the first end of the coupling portion being connected to the first coupling region and the second end of the coupling portion being connected to the second coupling region. The coupling portion, at least in the assembled state, is connected between the first end and the second end to the second contact portion. The first contact portion and/or the coupling portion, in the assembled state in the case of a change in state, caused by thermal expansion in particular, from a first state to a second state with an increase in the coupling region distance, impress a movement component along a second direction upon the second contact portion, with the second direction running across the first direction. This makes it possible to realize the variants and advantages described above to the same extent, and so reference is made to the explanations given above in this respect in order to avoid repetitions.

The present disclosure also relates to an optical imaging method, in particular a microlithographic optical imaging method, wherein an illumination device which comprises a first optical element group illuminates an object and a projection device which comprises a second optical element group projects an image representation of the object onto an image device. At least one first component of the illumination device and/or the projection device is connected to a second component via the according to the disclosure. This likewise makes it possible to realize the variants and advantages described above in relation to the optical arrangement to the same extent, and so reference is made to the explanations given above in this respect in order to avoid repetition.

Optionally, the first component is an optical element of the illumination device or the projection device, while the second component can be a part of a support structure of the illumination device or the projection device.

Further aspects and exemplary embodiments of the disclosure are evident from the dependent claims and the following description of exemplary embodiments, which refers to the accompanying figures. All combinations of the disclosed features, irrespective of whether or not they are the subject of a claim, lie within the scope of protection of the disclosure.

DETAILED DESCRIPTION OF THE DISCLOSURE

First Exemplary Embodiment

Figures 1, 2:
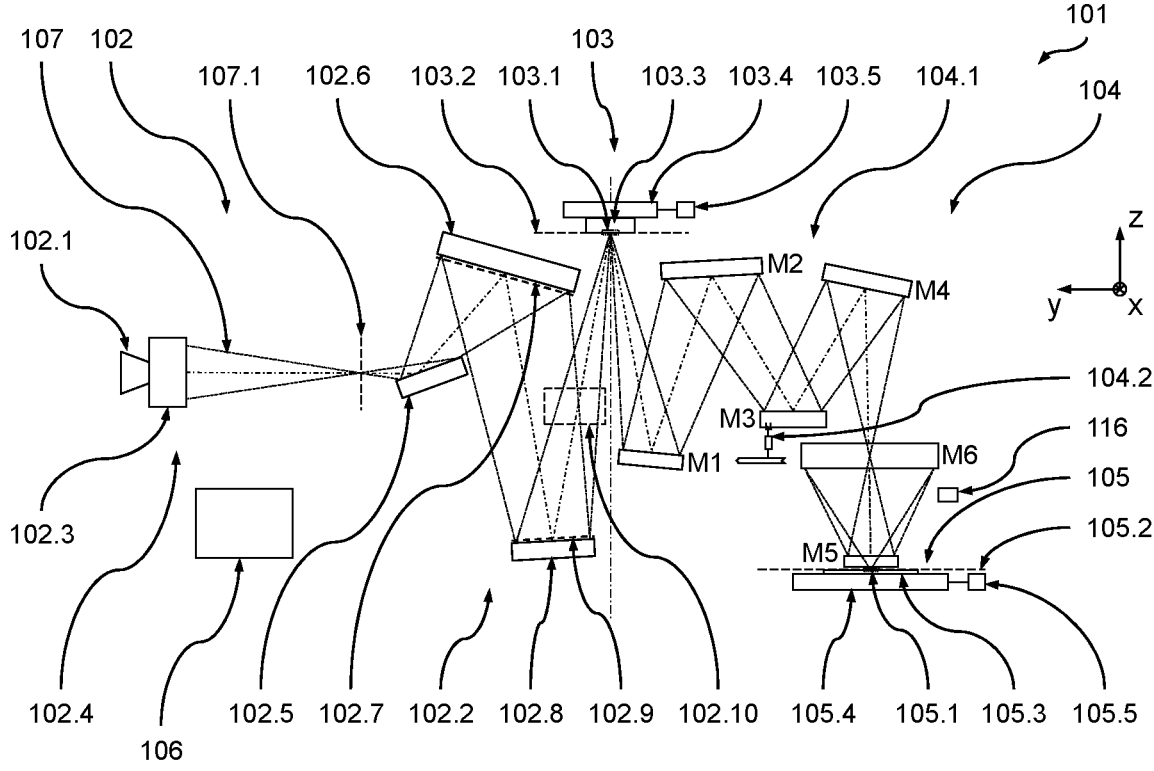
FIG. 1 is a schematic illustration of an embodiment of a projection exposure apparatus according to the disclosure, which comprises an embodiment of an optical arrangement according to the disclosure having an optical element connected to a support structure via an embodiment of a connection arrangement according to the disclosure.
FIG. 2 is a schematic sectional view of a part of the arrangement according to the disclosure from FIG. 1.

An exemplary embodiment of a microlithographic projection exposure apparatus 101 according to the disclosure, which comprises an exemplary embodiment of an optical arrangement according to the disclosure, is described below with reference to FIGS. 1 to 4. To simplify the following explanations, an xyz-coordinate system is indicated in the drawings, the z-direction running parallel to the direction of gravitational force. Accordingly, the x-direction and the y-direction run horizontally, with the x-direction running perpendicularly into the plane of the drawing in the illustration in FIG. 1. It goes without saying that it is possible in further configurations to choose any desired other orientations of an xyz-coordinate system.

Certain constituent parts of a projection exposure apparatus 101 are described in exemplary fashion below, initially with reference to FIG. 1. The description of the basic setup of the projection exposure apparatus 101 and its components should not be regarded as limiting here.

An illumination device or an illumination system 102 of the projection exposure apparatus 101 comprises, in addition to a radiation source 102.1, an optical element group in the form of illumination optical unit 102.2 for illuminating an object field 103.1 (shown schematically). The object field 103.1 lies in an object plane 103.2 of an object device 103. A reticle 103.3 (also referred to as a mask) arranged in the object field 103.1 is illuminated in this case. The reticle 103.3 is held by a reticle holder 103.4. The reticle holder 103.4 is displaceable by way of a reticle displacement drive 103.5, in particular in one or more scanning directions. In the present example, such a scanning direction runs parallel to the y-axis.

The projection exposure apparatus 101 furthermore comprises a projection device 104 with a further optical element group in the form of projection optical unit 104.1. The projection optical unit 104.1 serves for imaging the object field 103.1 into an image field 105.1 (as depicted schematically), which is located in an image plane 105.2 of an image device 105. The image plane 105.2 extends parallel to the object plane 103.2. Alternatively, an angle that differs from 0° between the object plane 103.2 and the image plane 105.2 is also possible.

During exposure, a structure of the reticle 103.3 is imaged onto a light-sensitive layer of a substrate in the form of a wafer 105.3, the light-sensitive layer being arranged in the image plane 105.2 in the region of the image field 105.1. The wafer 105.3 is held by a substrate holder or wafer holder 105.4. The wafer holder 105.4 is displaceable, in particular along the y-direction, by way of a wafer displacement drive 105.5. The displacement firstly of the reticle 103.3 by way of the reticle displacement drive 103.5 and secondly of the wafer 105.3 by way of the wafer displacement drive 105.5 can be implemented so as to be mutually synchronized. This synchronization can be implemented, for example, by way of a common control device 106 (shown only very schematically in FIG. 1 and without control paths).

The radiation source 102.1 is an EUV radiation (extreme ultraviolet radiation) source. The radiation source 102.1 emits EUV radiation 107 in particular, which is also referred to below as used radiation or illumination radiation. In particular, the used radiation has a wavelength in the range between 5 nm and 30 nm, in particular a wavelength of approximately 13 nm. The radiation source 102.1 can be a plasma source, for example an LPP (laser produced plasma) source or a GDPP (gas discharge produced plasma) source. It may also be a synchrotron-based radiation source. However, the radiation source 102.1 can also be a free electron laser (FEL).

Since the projection exposure apparatus 101 operates with used light in the EUV range, the optical elements used are exclusively reflective optical elements. In further configurations of the disclosure, it is also possible (in particular depending on the wavelength of the illumination light), of course, to use any type of optical elements (refractive, reflective, diffractive) on an individual basis or in any desired combination for the optical elements.

The illumination radiation 107 emanating from the radiation source 102.1 is focused by a collector 102.3. The collector 102.3 may be a collector with one or more ellipsoidal and/or hyperboloid reflection surfaces. The illumination radiation 107 may be incident on the at least one reflection surface of the collector 102.3 with grazing incidence (GI), which is to say at angles of incidence of greater than 45°, or with normal incidence (NI), which is to say at angles of incidence of less than 45°. The collector 11 may be structured and/or coated, firstly to optimize its reflectivity for the used radiation and secondly to suppress extraneous light.

Downstream of the collector 102.3, the illumination radiation 107 propagates through an intermediate focus in an intermediate focal plane 107.1. In certain variants, the intermediate focal plane 107.1 can represent a separation between the illumination optical unit 102.2 and a radiation source module 102.4, which comprises the radiation source 102.1 and the collector 102.3.

Along the beam path, the illumination optical unit 102.2 includes a deflection mirror 102.5 and a downstream first facet mirror 102.6. The deflection mirror 102.5 may be a planar deflection mirror or, alternatively, a mirror with a beam-influencing effect going beyond the pure deflection effect. In an alternative or in addition, the deflection mirror 102.5 can be designed as a spectral filter which at least partially separates what is known as extraneous light from the illumination radiation 107, the wavelength of which extraneous light differs from the used light wavelength. If the optically effective surfaces of the first facet mirror 102.6 are arranged in the region of a plane of the illumination optical unit 102.2 which is optically conjugate to the object plane 103.2 as a field plane, the first facet mirror 102.6 is also referred to as a field facet mirror. The first facet mirror 102.6 comprises a plurality of individual first facets 102.7, which are also referred to below as field facets. These first facets and their optical surfaces are indicated only very schematically in FIG. 1 by the dashed contour 102.7.

The first facets 102.7 may be embodied as macroscopic facets, in particular as rectangular facets or as facets with an arcuate or part-circular edge contour. The first facets 102.7 may be embodied as facets with a plane optical surface or alternatively with a convexly or concavely curved optical surface.

As known for example from DE 10 2008 009 600 A1 (the entire disclosure of which is incorporated herein by reference), the first facets 102.7 themselves can also be composed in each case of a plurality of individual mirrors, in particular a plurality of micromirrors. The first facet mirror 102.6 can in particular be designed as a microelectromechanical system (MEMS system), as is described in detail in DE 10 2008 009 600 A1, for example.

In the present example, the illumination radiation 107 travels horizontally, which is to say in the y-direction, between the collector 102.3 and the deflection mirror 102.5. It goes without saying, however, that in the case of other variants different alignments may also be chosen.

In the beam path of the illumination optical unit 102.2, a second facet mirror 102.8 is arranged downstream of the first facet mirror 102.6. If the optically effective surfaces of the second facet mirror 102.8 are arranged in the region of a pupil plane of the illumination optical unit 102.2, the second facet mirror 102.8 is also referred to as a pupil facet mirror. The second facet mirror 102.8 can also be arranged at a distance from a pupil plane of the illumination optical unit 102.2. In this case, the combination of the first facet mirror 102.6 and the second facet mirror 102.8 is also referred to as a specular reflector. Such specular reflectors are known, for example, from US 2006/0132747 A1, EP 1 614 008 B1 or U.S. Pat. No. 6,573,978 (the respective entire disclosure of which is incorporated herein by reference).

The second facet mirror 102.8 in turn comprises a plurality of second facets, which are indicated only very schematically in FIG. 1 by the dashed contour 102.9. In the case of a pupil facet mirror, the second facets 102.9 are also referred to as pupil facets. In general, the second facets 102.9 can have the same design as the first facets 102.7. In particular, the second facets 102.9 can likewise be macroscopic facets, which can have a round, rectangular or hexagonal edge, for example. Alternatively, the second facets 102.9 can be facets composed of micromirrors. The second facets 102.9 in turn may have plane reflection surfaces or alternatively reflection surfaces with convex or concave curvature. In this regard, reference is made anew to DE 10 2008 009 600 A1.

In the present example, the illumination optical unit 102.2 consequently forms a doubly faceted system. This basic principle is also referred to as fly's eye integrator. In certain variants, it may furthermore be advantageous to arrange the optical surfaces of the second facet mirror 102.8 not exactly in a plane which is optically conjugate to a pupil plane of the projection optical unit 104.1.

In a further embodiment, not shown, of the illumination optical unit 102.2, a transfer optical unit 102.10 (depicted only schematically) contributing in particular to the imaging of the first facets 102.7 into the object field 103.1 may be arranged in the beam path between the second facet mirror 102.8 and the object field 103.1. The transfer optical unit 102.10 may have exactly one mirror, or alternatively have two or more mirrors, which are arranged one behind the other in the beam path of the illumination optical unit 102.2. The transfer optical unit 102.10 may in particular comprise one or two normal-incidence mirrors (NI mirrors) and/or one or two grazing-incidence mirrors (GI mirrors).

In the embodiment as shown in FIG. 1, the illumination optical unit 102.2 has exactly three mirrors downstream of the collector 102.3, specifically the deflection mirror 102.5, the first facet mirror 102.6 (e.g., a field facet mirror), and the second facet mirror 102.8 (e.g., a pupil facet mirror). In a further embodiment of the illumination optical unit 102.2, there is also no need for the deflection mirror 102.5, and so the illumination optical unit 102.2 may then have exactly two mirrors downstream of the collector 102.3, specifically the first facet mirror 102.6 and the second facet mirror 102.8.

With the aid of the second facet mirror 102.8, the individual first facets 102.7 are imaged into the object field 103.1. The second facet mirror 102.8 is the last beam-shaping mirror or indeed the last mirror for the illumination radiation 107 in the beam path upstream of the object field 103.1. The imaging of the first facets 102.7 into the object plane 103.2 via the second facets 102.9 or using the second facets 102.9 and a transfer optical unit 102.10 is often only approximate imaging.

The projection optical unit 104.1 comprises a plurality of mirrors M1, which are numbered in accordance with their arrangement along the beam path of the projection exposure apparatus 101. In the example illustrated in FIG. 1, the projection optical unit 104.1 comprises six mirrors M1 to M6. Alternatives with four, eight, ten, twelve, or any other number of mirrors M1 are likewise possible. The penultimate mirror M5 and the last mirror M6 may each have a passage opening (not depicted in any more detail) for the illumination radiation 107. In the present example, the projection optical unit 104.1 is a doubly obscured optical unit. The projection optical unit 104.1 has an image-side numerical aperture NA which is greater than 0.5. In particular, the image-side numerical aperture NA may also be greater than 0.6. By way of example, the image-side numerical aperture NA may be 0.7 or 0.75.

The reflection surfaces of the mirrors M1 may be in the form of free-form surfaces without an axis of rotational symmetry. In an alternative, the reflection surfaces of the mirrors M1 may be designed as aspheric surfaces with exactly one axis of rotational symmetry of the reflection surface shape. Just like the mirrors of the illumination optical unit 102.2, the mirrors M1 may have highly reflective coatings for the illumination radiation 107. These coatings can be constructed from a plurality of coatings (multilayer coatings); in particular, they may be designed with alternating layers of molybdenum and silicon.

In the present example, the projection optical unit 104.1 has a large object-image offset in the y-direction between a y-coordinate of a center of the object field 103.1 and a y-coordinate of the center of the image field 105.1. This object-image offset in the y-direction can be of approximately the same magnitude as a distance between the object plane 103.2 and the image plane 105.2 in the z-direction.

The projection optical unit 104.1 may in particular have an anamorphic form. In particular, it has different imaging scales βx, βy in the x- and y-directions. The two imaging scales βx, βy of the projection optical unit 104.1 can be (βx, (βy)=(+/−0.25, +/−0.125). A positive imaging scale β means imaging without image inversion. A negative sign for the imaging scale β means imaging with image inversion. In the present example, the projection optical unit 104.1 consequently leads to a reduction in size with a ratio of 4:1 in the x-direction, which is to say in a direction perpendicular to the scanning direction. By contrast, the projection optical unit 104.1 leads to a reduction in size in the ratio of 8:1 in the y-direction, which is to say in the scanning direction. Other imaging scales are likewise possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 103.1 and the image field 105.1 can be the same. Likewise, the number of intermediate image planes may also differ, depending on the design of the projection optical unit 104.1. Examples of projection optical units with differing numbers of such intermediate images in the x- and y-directions are known, for example, from US 2018/0074303 A1 (the entire disclosure of which is incorporated herein by reference).

In each case one of the pupil facets 102.9 in the present example is assigned to exactly one of the field facets 102.7 for forming in each case an illumination channel for illuminating the object field 103.1. This may in particular result in illumination according to the Köhler principle. The far field is deconstructed into a plurality of object fields 103.1 with the aid of the field facets 102.7. The field facets 102.7 generate a plurality of images of the intermediate focus on the pupil facets 102.9 respectively assigned thereto.

The field facets 102.7 are each imaged onto the reticle 103.3 by an assigned pupil facet 102.9, with the image representations being overlaid such that there is thus an overlaid illumination of the object field 103.1. The illumination of the object field 103.1 can be as homogeneous as possible. It can have a uniformity error of less than 2%. The field uniformity can be achieved by way of the overlay of different illumination channels.

The illumination of the entrance pupil of the projection optical unit 104.1 can be defined geometrically by way of an arrangement of the pupil facets 102.9. The intensity distribution in the entrance pupil of the projection optical unit 104.1 can be set by selecting the illumination channels, in particular the subset of the pupil facets 102.9 which guide light. This intensity distribution is also referred to as illumination setting of the illumination system 102. A likewise preferred pupil uniformity in the region of portions of an illumination pupil of the illumination optical unit 102.2 which are illuminated in a defined manner may be achieved by a redistribution of the illumination channels. In the case of actively adjustable facets, the aforementioned settings can be made in each case by corresponding control by way of the control device 106.

Further aspects and details of the illumination of the object field 103.1 and in particular of the entrance pupil of the projection optical unit 104.1 are described hereinafter.

The projection optical unit 104.1 may in particular have a homocentric entrance pupil. The latter can be accessible or else be inaccessible. The entrance pupil of the projection optical unit 104.1 frequently cannot be exactly illuminated using the pupil facet mirror 102.8. In the case of imaging of the projection optical unit 104.1 which telecentrically images the center of the pupil facet mirror 102.8 onto the wafer 105.3, the aperture rays often do not intersect at a single point. However, it is possible to find an area in which the spacing of the aperture rays that is determined in pairs becomes minimal. This area represents the entrance pupil or an area in real space that is conjugate thereto. In particular, this area has a finite curvature.

It may be the case for certain variants that the projection optical unit 104.1 has different poses of the entrance pupil for the tangential beam path and for the sagittal beam path. In this case, it is optional for an imaging optical element, in particular an optical component part of the transfer optical unit 102.10, to be provided between the second facet mirror 102.8 and the reticle 103.3. With the aid of this imaging optical element, the different poses of the tangential entrance pupil and the sagittal entrance pupil can be taken into account.

With the arrangement of the components of the illumination optical unit 102.2, as shown in FIG. 1, the optical surfaces of the pupil facet mirror 102.8 are arranged in a surface that is conjugate to the entrance pupil of the projection optical unit 104.1. The first facet mirror 102.6 (field facet mirror) defines a first main plane of extent of its optical surfaces, which is arranged tilted to the object plane 5 in the present example. In the present example, this first main plane of extent of the first facet mirror 102.6 is arranged tilted to a second main plane of extent, which is defined by the optical surface of the deflection mirror 102.5. In the present example, the first main plane of extent of the first facet mirror 102.6 is also arranged tilted to a third main plane of extent, which is defined by the optical surfaces of the second facet mirror 102.8.

The optical element groups 102.2, 104.1 may comprise one or more optical arrangements 108 according to the disclosure, as is described below with reference to the mirror M3 which forms an optical element of the optical element group 104.1.

The optical arrangement 108 comprises a connection arrangement 109 according to the disclosure for connecting a first component in the form of a support unit 104.2 and a second component in the form of the mirror M3, which are connected via a connection unit 110.

The support unit 104.2 connects the optical element M3 to a support structure of the projection device 104 in order to support the optical element M3 on the support structure by way of a supporting force, as is only shown in highly schematic form in FIG. 1 for the optical element M3. For example, the support unit 104.2 can be part of a conventional parallel kinematic system, for example of a well-known hexapod kinematic system. In particular, the support can be actively designed so that the rigid body pose of the optical element M3 (i.e., its position and orientation in the six degrees of freedom in space) can be set in space in one or more of the degrees of freedom (up to all six degrees of freedom) by virtue of the support units 104.2 being controlled accordingly by the control device 106.

The connection unit 110 comprises a first contact portion 110.1, a second contact portion 110.2, and a coupling portion 110.3. In the assembled state shown in FIG. 2, the first contact portion 110.1 contacts the support unit 104.2 (i.e., the first component), while the second contact portion 110.2 contacts the mirror M3 (i.e., the second component). The coupling portion 110.3 connects the first contact portion 110.1 and the second contact portion 110.2, wherein it defines a center axis 110.4.

Figures 3, 4, 5, 6:
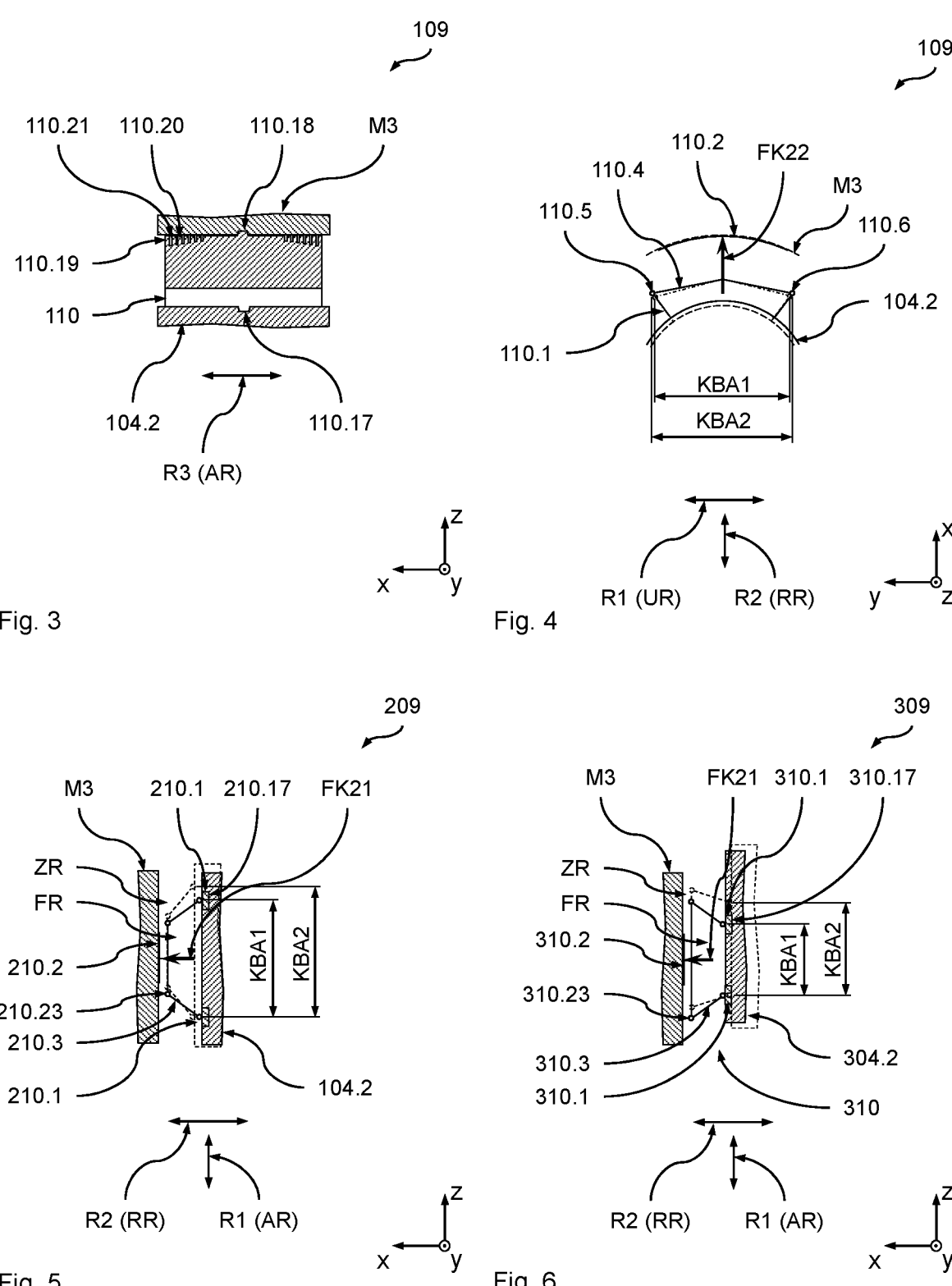
FIG. 3 is a schematic sectional view (see line in FIG. 2) through a part of the arrangement from FIG. 2.
FIG. 4 is a schematic mechanical equivalent circuit diagram of a part of the arrangement from FIG. 2.
FIG. 5 is a schematic mechanical equivalent circuit diagram of a further embodiment of the connection arrangement according to the disclosure.
FIG. 6 is a schematic mechanical equivalent circuit diagram of a further embodiment of the connection arrangement according to the disclosure.

The first contact portion 110.1 comprises a first coupling region 110.5 and a second coupling region 110.6, which in a first direction R1 has a coupling region distance KBA from the first coupling region 110.5, the coupling region distance being a first coupling region distance KBA1 in a first state Z1 and being a second coupling region distance KBA2 in a second state Z2 (see FIG. 4). The coupling portion 110.3 has a first end 110.7 and an opposite second end 110.8, wherein the coupling portion 110.3 (in the assembled state) couples together the first contact portion 110.1 and the second contact portion 110.2. To this end, firstly, the first end 110.7 of the coupling portion is connected to the first coupling region 110.5 and the second end 110.8 of the coupling portion is connected to the second coupling region 110.6. Secondly, the coupling portion 110.3, in the assembled state, is connected between the first end 110.7 and the second end 110.8 to the second contact portion 110.2. In the present example, the second contact portion 110.2 is located substantially in the middle between the first end 110.7 and the second end 110.8. However, it is understood that, in particular depending on the desired profile of the contact force or the compensation movement, a correspondingly off-center link of the second contact portion 110.2 to the coupling portion 110.3 can also be provided.

In the present example, the first contact portion 110.1 and the coupling portion 110.3 are designed in such a way that, in the assembled state in the case of a change in state, caused by thermal expansion, from the first state Z1 to the second state Z2 with an increase in the coupling region distance (from KBA1 to KBA2), a movement component along a second direction R2 is impressed upon the second contact portion 110.2, with the second direction running across the first direction.

This is depicted schematically in FIG. 4, wherein, in the case shown there, the movement component or the compensation movement, which is impressed upon the second contact portion 110.2 in the second direction R2 when the state changes from the first state Z1 to the second state Z2, is just so large that the second contact portion substantially does not change its position in space while the first contact portion 110.1 moves toward the mirror M3 (i.e., the second component) starting from the first state Z1 (dashed contour in FIG. 4) on account of a thermal expansion of the support unit 104.2 (i.e., the first component). The first contact portion 110.1 has thus approached the mirror M3 in the second state Z2 (continuous contour in FIG. 4).

It is understood that, in general, the connection unit 110, the first component 104.2, and the second component M3 can be arranged in any suitable manner to each other in order to obtain the desired connection. In the present example, the connection unit 110, in the assembled state, is arranged in an intermediate space ZR between the support unit 104.2 and the mirror M3. This intermediate space ZR arises because the support unit 104.2 is arranged in a recess 111 in the mirror M3.

In the present example, the support unit 104.2 has a greater coefficient of thermal expansion than the mirror M3, which in the present example can be constructed from a material with a coefficient of thermal expansion near zero. Therefore, the intermediate space ZR between the support unit 104.2 and the mirror M3 decreases when the state changes from the first state Z1 to the second state Z2. The movement component of the second contact portion 110.2 in the second direction R2 therefore points at the support unit 104.2 in order to achieve the desired compensation movement.

Figure 7:
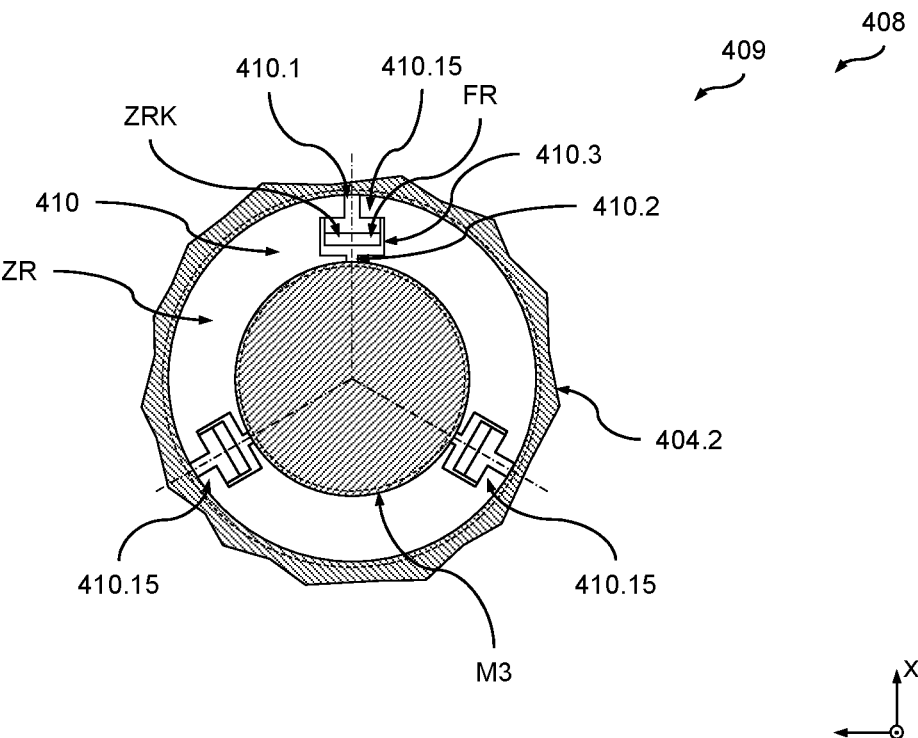
FIG. 7 is a schematic sectional view of a part of a further embodiment of the arrangement according to the disclosure (similar to the view of FIG. 2).
Figure 8:
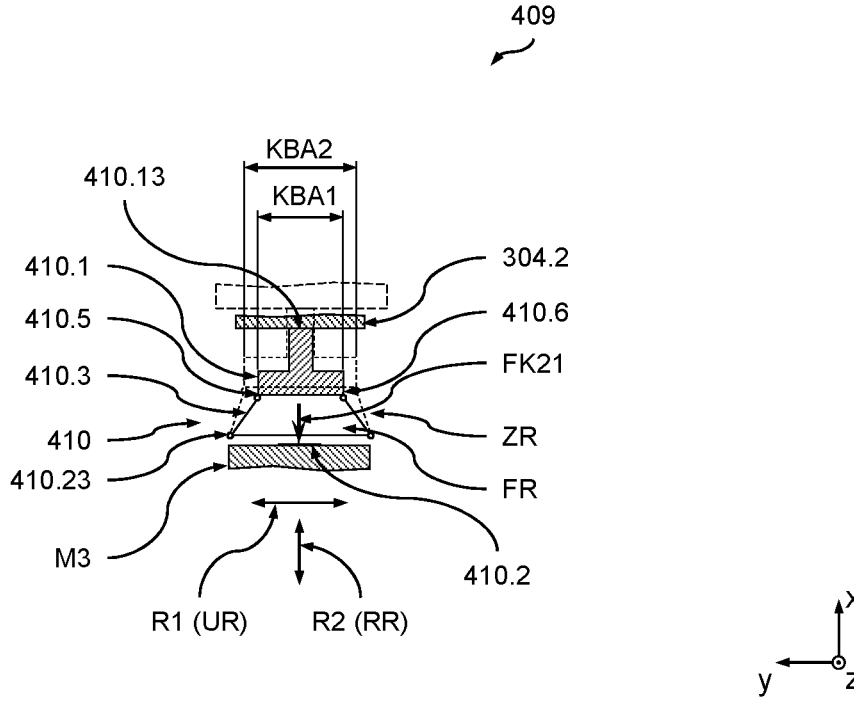
FIG. 8 is a schematic mechanical equivalent circuit diagram of a part of the arrangement from FIG. 7.

In other variants, the intermediate space ZR may however also increase when the state changes from the first state Z1 to a second state Z2, wherein the movement component of the second contact portion then points away from the first component along the second direction R2, in order to achieve the desired compensation movement; this will be explained below with reference to FIGS. 6, 7 and 8. Here, too, particularly advantageous and compact designs result in turn when the second component is located in a recess in the first component.

In general, the coupling portion 110.3 can be designed in a desired manner suitable for achieving the described compensation movement. For example, the coupling portion 110.3 may thus have a three-dimensionally curved and/or kinked profile, which is stretched when the coupling region distance KBA is increased in order to achieve the compensation movement. Naturally, any desirably complex three-dimensional expansion profiles of the two coupled components (i.e., for example, the support unit 104.2 and the mirror M3) can then also be taken into account in this case. Particularly simple and yet effective designs result when the coupling portion 110.3 has a curved and/or, like in the present example, kinked profile (consequently has this profile thus in a plane).

As is evident from FIGS. 2 and 4, the coupling portion 110.3 in the present example defines between the first end 110.7 and the second end 110.8 the center axis 110.4, which in the first state Z1 (see FIGS. 2 and 4) has an arcuate, first profile V1 between the first end 110.7 and the second end 110.8. In the second state Z2, in which the above-described increase in the coupling region distance from KBA1 to KBA2 is present, the center axis 110.4 between the first end 110.7 and the second end 110.8 then has a second profile V2, which is stretched in relation to the first profile V1 (see FIG. 4). This stretching then achieves the desired compensation movement in the second direction R2 in a simple way.

In certain variants, the second profile V2 can be arcuate like in the example of FIG. 4. However, the coupling portion 110.3 may also be stretched, if desired, so far that the second profile V2 is substantially straight. Likewise, the first profile V1 can be at least partially curved and/or at least partially polygonal. In certain variants, the second profile V2 can be at least partially curved and/or at least partially polygonal.

In certain variants, the center axis 110.4 of the coupling portion 110.3 between the first end 110.7 and the second end 110.7 can define a first mean curvature MK1 in the first state Z1 and a second mean curvature MK2 in the second state Z2, wherein the second mean curvature MK2 is less than the first mean curvature MK1. In this case, the second mean curvature MK2 can be in particular 95% to 0%, such as 75% to 5%, for example 50% to 10%, of the first mean curvature MK1. The desired compensation movement can be achieved in a particularly simple and compact way in all these cases either on an individual basis or in any combination.

As already explained above, in general desirably force curves can be obtained between the (thermal) first and second states Z1, Z2 for the contact forces FK relating to the two components 104.2 and M3. In certain advantageous variants, the second contact portion 110.2, in the first state Z1, exerts a first contact force FK21 on the mirror M3 (i.e., the second component), while the second contact portion, in the second state Z2, exerts a second contact force FK22 on the mirror M3. In this case, the first contact portion 110.1 and/or the coupling portion 110.3 can be designed in such a way that the second contact force FK22 is 80% to 120%, such as 90% to 110%, for example 95% to 105%, of the first contact force FK21.

In certain variants, the first contact portion 110.1 and/or the coupling portion 110.3 can also be designed in such a way that, during the transition from the first state Z1 to the second state Z2, the contact force FK exerted by the second contact portion 110.2 on the mirror M3 varies at most by 15% to 20%, such as by no more than 5% to 10%, for example by no more than 1% to 3%, of the first contact force FK21. Particularly advantageous contact force curves are achieved respectively on an individual basis or in combination as a result.

In general, the connection unit 110 can be designed as an unalterably preset unit. In particularly advantageous variants, the connection unit 110 may comprise at least one adjustment device for setting the first contact force FK21, as indicated in FIG. 2 by the dashed contours 110.9 and 110.10. In certain variants, the adjustment can also be made here by changing the coupling region distance KBA.

In the present example, the first contact portion 110.1 comprises a first contact segment 110.11 and a second contact segment 110.12 which, in the assembled state, each contact the support unit 104.2 by way of a component contact surface 110.13, 110.14. In this case, the first contact segment 110.11 and the second contact segment 110.12 are spaced apart from one another, forming a free space FR, along the first direction R1. In this case, the first contact segment 110.11 forms the first coupling region 110.5, while the second contact segment 110.12 forms the second coupling region 110.6. The coupling portion 110.3, in the assembled state, bridges the free space FR in arcuate fashion. This obtains a particularly advantageous configuration, since the two separate contact segments 110.11, 110.12 (connected via the coupling portion 110.3) can easily follow thermally induced relative movements with respect to one another.

It is understood that, in other variants, the two contact segments 110.11, 110.12 can also be connected via at least one further portion, for example in the region of their respective contact surface to the support unit 104.2. In that case, all that still needs to be provided is a sufficient free space FR, for example a gap or the like, so that the coupling portion 110.3 can perform the compensation movement. In particular, for example, the first contact portion 110.1 may be designed to be contiguous in such a way that the first coupling region 110.5 and the second coupling region 110.6 are formed by a single common segment of the connection unit 110, which is then separated from the coupling portion 110.3 by an appropriate intermediate space, for example a gap.

In the present example, the component contact surface 110.13 of the first contact segment 110.11 is spaced apart from the first coupling region 110.5 in the second direction R2. A comparable statement holds true for the component contact surface 110.14 of the second contact segment 110.12, which is spaced apart from the second coupling region 110.6 in the second direction R2. This respective distance can in each case advantageously influence the overall displacement between the first contact portion 110.1 and the second contact portion 110.2 because the thermally induced displacement of the coupling portion 110.3 away from the support unit 104.2 increases as this distance increases. In the case of a given compensation movement by the coupling portion 110.3, it is then possible to adjust the distance accordingly thereto, in order to obtain a given overall displacement between the first contact portion 110.1 and the second contact portion 110.2.

In the present example, these two distances are chosen to be at least approximately the same. It is understood, however, that in the case of a deviation from the symmetry shown, certain translational and/or rotational movement components of the compensation movement can also be obtained, since there can be an uneven displacement of the coupling regions 110.5 and 110.6 in that case. Naturally, it is likewise thus also possible to take into account an uneven temperature distribution and compensate for the consequences of the unevenness at least in part.

In the present example, the first contact segment 110.11, the second contact segment 110.12, the coupling portion 110.3, and the second contact portion 110.2 are parts of a connection element 110.15 with a monolithic embodiment. This results in a particularly compact and easy-to-use configuration in which the connection element 110.15 advantageously maintains tight tolerances.

In general, it may be sufficient for the connection unit 110 to comprise only one such connection element 110.15. In the present example, however, the connection element 110.15 is a first connection element, while the connection unit 110 comprises two additional connection elements 110.15. In this case, it is understood that, in general, the connection unit 110 may comprise N additional connection elements 110.15, where N can have the value of 1 to 5, such as 2 to 4, for example 2 to 3. What is true here in general is that a greater number of connection elements 110.15 enables a finer or more evenly distributed transfer of the loads between the support unit 104.2 and the mirror M3.

In general, the first connection element 110.15 and the additional connection elements 110.15 can be designed differently, for example to account for certain uneven distributions of the loads to be transferred between the support unit 104.2 and the mirror M3. However, in the present example, the additional connection elements 110.15 are designed to be at least substantially identical to the first connection element 110.15.

In the assembled state, the first connection element 110.15 and the additional connection elements 110.15 can be arranged separately from one another. In particularly compact and easy-to-assemble variants, a contact segment 110.11, 110.12 of the first connection element 110.15, in the assembled state, contacts an adjacent contact segment 110.11, 110.12 of the adjacent additional connection element 110.15, as is the case in the present example. In this case, the connection elements 110.15 can be formed separately in the region of their contact surfaces 110.16. However, likewise, the connection elements 110.15 may also have a monolithic embodiment with one another, whereby in particular the handling and assembly is simplified.

In general, the connection unit 110 can have any desired design depending on the design of the components to be connected (102.4, M3). For example, it may thus have a generally linear or arcuate profile. In certain variants, the connection unit 110 is of ring-shaped design like in the present example. In this case, the connection unit 110 for example can contact an outer circumference of the first component 104.2, wherein the connection unit 110 can then surround a portion of the first component 104.2 in ring-shaped fashion, as is the respective case in the present example. Likewise, the connection unit 110 can contact the wall of a recess 111 in the second component M3, wherein the connection unit can then be inserted into the recess 111 in the second component, as is also the respective case in the present example. Particularly advantageous, compact configurations are achieved in all these cases.

In respect of the materials used, the connection arrangement 109 can be matched to the materials of the first and second component, which is to say of the support unit 104.2 and the mirror M3 in the present example. In certain advantageous variants, the support unit 104.2, at least in its region adjacent to the first contact portion 110.1, is constructed from a first material having a first coefficient of thermal expansion CTE1, while the mirror M3, at least in its region adjacent to the second contact portion 110.2, is constructed from a second material having a second coefficient of thermal expansion CTE2. The connection unit 110 is constructed from a third material having a third coefficient of thermal expansion CTE3, wherein the following can be realized on an individual basis or in any combination.

Thus, the first coefficient of thermal expansion CTE1 can be greater than the second coefficient of thermal expansion CTE2 and the third coefficient of thermal expansion CTE3. Likewise, the second coefficient of thermal expansion CTE2 can be greater than the third coefficient of thermal expansion CTE3. Furthermore, the second coefficient of thermal expansion CTE2 can be 5% to 25%, such as 8% to 20%, for example 12% to 18%, of the first coefficient of thermal expansion CTE1. Likewise, the third coefficient of thermal expansion CTE3 can be 5% to 50%, such as 10% to 40%, for example 20% to 30%, of the first coefficient of thermal expansion CTE1. In this case, the third coefficient of thermal expansion CTE3 may be located at any suitable location in the interval between the first and second coefficient of thermal expansion (i.e., CTE1>CTE3>CTE2 may apply in any case). The difference between the first coefficient of thermal expansion CTE1 and the third coefficient of thermal expansion CTE3 can be 40% to 95%, such as 50% to 90%, for example 75% to 88%, of the difference between the first coefficient of thermal expansion CTE1 and the second coefficient of thermal expansion CTE2.

However, it is understood that, in other variants, the third coefficient of thermal expansion CTE3 may however also be located outside the interval between the first coefficient of thermal expansion CTE1 and second coefficient of thermal expansion CTE2. This may be advantageous for obtaining a certain overall displacement between the support unit 104.2 and the mirror M3 by way of the combination of the thermal expansion of the connection unit 110 and the compensation movement.

The first coefficient of thermal expansion CTE1 can be $10 \cdot 10^{-6} K^{-1}$ to $20 \cdot 10^{-6} K^{-1}$, such as $11 \cdot 10^{-6} K^{-1}$ to $17 \cdot 10^{-6} K^{-1}$, for example $13 \cdot 10^{-6} K^{-1}$ to $15 \cdot 10^{-6} K^{-1}$, while the second coefficient of thermal expansion CTE2 can be $0.5 \cdot 10^{-6} K^{-1}$ to $4 \cdot 10^{-6} K^{-1}$, such as $1 \cdot 10^{-6} K^{-1}$ to $3 \cdot 10^{-6} K^{-1}$, for example $1 \cdot 10^{-6} K^{-1}$ to $2 \cdot 10^{-6} K^{-1}$, and the third coefficient of thermal expansion CTE3 can be $2 \cdot 10^{-6} K^{-1}$ to $6 \cdot 10^{-6} K^{-1}$, such as $2.5 \cdot 10^{-6} K^{-1}$ to $5 \cdot 10^{-6} K^{-1}$, for example $3 \cdot 10^{-6} K^{-1}$ to $4 \cdot 10^{-6} K^{-1}$.

In general, the connection unit 110 can be secured relative to the support unit 104.2 or the mirror M3 in any appropriate manner. Thus, on an individual basis or in any combination in one or more degrees of freedom (up to all six degrees of freedom in space), a frictionally connected, an interlocking or an integrally bonded link may be provided.

In the present example, the contact portions 110.1, 110.2 comprise, in their region adjacent to the directly contacted component, a securing portion 110.17, 110.18 which is designed to secure via a form fit the contact portion 110.1 or 110.2 and the directly contacted component 104.2, M3 in a third direction R3 which runs across the first and the second direction R1, R2, as explained in more detail below using the example of the securing portion 110.18. This obtains a particularly simple and compact configuration which allows a thermal expansion in a simple manner. In this context, it is advantageous if, like in the present example, in the third direction R3, the securing portion 110.17 is arranged in a central region of the contact portion 110.2, since this renders possible an expansion to both sides, in which the local relative movements between the connection unit 110 and the mirror M3 to be absorbed overall are reduced or minimized.

In the present example, the first contact portion 110.1 has, in its region adjacent to the support unit 104.2, a first securing portion 110.17, while the second contact portion 110.2 has, in its region adjacent to the mirror M3, a second securing portion 110.18. In this case, the securing portion 110.18 is formed by a projection which extends in a plane perpendicular to the third direction R3 and, in the assembled state, engages in an assigned recess in the directly contacted mirror M3.

In certain variants, in the assembled state, the securing portion may also be formed by an adhesive bond, which is formed in the region of at least one depression in the respective contact portion 110.1, 110.2. In particular, the above-described setting of the contact force curve or the compensation movement can be advantageously used here to compensate for shrinkage effects of the adhesive bond.

In the present example, the contact portions 110.1, 110.2, in their region adjacent to the directly contacted component 104.2, M3, each comprise a compensation portion 110.19, as explained below on the basis of the contact portion 110.2. The compensation portion 110.19 is designed to absorb via elastic deformation a differing thermal expansion between the contact portion 110.2 and the directly contacted mirror M3 in the third direction R3. This can advantageously reduce parasitic stresses that result from the different thermal expansion in the third direction R3.

In the present example, the respective contact portion 110.1, 110.2 comprises such a compensation portion 110.19, which is formed by elastic portions 110.20 which are spaced apart from one another along the third direction R3 and the resilience of which along the third direction R3 increases along the third direction R3 from a central portion of the contact portion 110.2 to the ends of the contact portion 110.2. In this case, the elastic portions 110.20 are formed by leaf-spring-like elements, the length of which increases toward the ends of the contact portion 110.2. In the present example, the different length of the leaf-spring-like elements is defined simply by slots 110.21 of different depths across the third direction R3 in the contact portion 110.2. In this case, the depth of the slots 110.21 can increase along the third direction R3 from the central portion to the ends of the contact portion 110.2, in order to set the desired resilience. However, in addition or an alternative, the desired resilience may likewise also be set via the spacing of the slots 110.21 or the thickness of the elastic portions 110.20 defined thereby (in each case along the third direction R3).

It is understood that the connection arrangement 109 can be used in general to connect any desired components. The advantages specified herein particularly readily come to bear if the first component 104.2, like in the present example, is a constituent part of a support structure for an optical element such as the mirror M3, constructed from at least one of the materials steel, a metal with low thermal expansion, and a non-metal with low thermal expansion. Likewise, it is advantageous if the second component is an optical element like the mirror M3, which is constructed from at least one of the materials ceramic, Zerodur, and ULE® glass. Optionally, the connection unit 110 may then be constructed from at least one of the materials tungsten, and a tungsten alloy.

It is understood that, in general, the connection unit 110 can be designed and used in any manner appropriate for providing the compensation movement in a second direction R2 matched to the first and second component. Particularly advantageous configurations arise if the first component, like in the present example, defines an axial direction AR, a radial direction RR, and a circumferential direction UR, and the second direction R2 runs at least substantially along the radial direction RR. In this case, the first direction R1 can run at least substantially along the circumferential direction UR. Likewise, however, the first direction R1 can also run at least substantially along the axial direction AR, as will be explained in more detail below on the basis of FIGS. 5 and 6.

In general, the second contact portion 110.2 can be designed in any suitable way for obtaining the desired link to the mirror M3. Particularly advantageous configurations arise when the second contact portion, like in the present example, has a substantially T-shaped or mushroom-shaped cut contour in a plane defined by the first and second direction R1, R2 (see FIG. 2). This enables an advantageous, large-area introduction of load into the mirror M3 to be obtained. Optionally, the second contact portion 110.2, like in the present example, has a narrow bridge-like portion 110.22, via which the second contact portion 110.2 is connected to the coupling portion 110.3, wherein a longitudinal axis of the bridge-like portion runs across the first and second direction R1, R2. In this case, the portion 110.22 may optionally also be formed as a type of flexure in order to absorb or allow tilting movements about the longitudinal axis of the bridge-like portion 110.22.

With the connection arrangement 109 described above, the methods according to the disclosure can be performed, and so reference is made to the explanations above in this regard.

Second Exemplary Embodiment

An embodiment of the arrangement 208 according to the disclosure, which can be used in the imaging device 101 of FIG. 1 instead of the arrangement 108, is described below with reference to FIGS. 1 and 5. The arrangement 208 corresponds in its basic design and functionality to the arrangement 108 from FIGS. 2 to 4, and so only the differences are to be discussed here. In particular, identical components are provided with identical reference numerals, while similar components are provided with reference numerals increased by the value 100. Unless stated otherwise below, reference is made to the above statements in connection with the first exemplary embodiment with regard to the features, functions and advantages of these components.

One difference from the first exemplary embodiment is that the first direction R1 runs along the axial direction AR of the support unit 104.2 or the mirror M3, while the second direction R2 runs along the radial direction RR again. In this example, the increase in the coupling region distance KBA from the first state Z1 (KBA1—continuous contour in FIG. 5) to the second state Z2 (KBA2—dashed contour in FIG. 5) is thus achieved by the thermally induced axial change in length of the support unit 104.2. In this case, however, a compensation movement of the second contact portion 210.2 is achieved in turn by the stretching of the arcuate coupling portion 210.3, which to the desired extent compensates or to a desired extent influences (i.e., sets the intermediate space ZR to a desired dimension) the expansion-related approach of the first contact portion 210.1 to the second contact portion 210.2 (i.e., the reduction of the intermediate space ZR between the support unit 104.2 and the mirror M3).

Likewise in turn, a desired contact force curve can be set, wherein an adjustment device 210.17 may also be provided here to set the contact force FK21. This, too, can be implemented in turn by changing the coupling region distance KBA1 in the first state Z1.

Otherwise, the connection unit 210 can be constructed in a manner analogous to the connection unit 110. Likewise, however, the connection unit 210 may also comprise precisely defined joint sections 210.23 (for example, flexures), via which the kinematics of the arcuate coupling portion 210.3 are precisely defined.

With this connection arrangement 209 described above, too, the methods according to the disclosure can be performed, and so reference is made in this regard to the explanations above.

Third Exemplary Embodiment

An embodiment of the arrangement 308 according to the disclosure, which can be used in the imaging device 101 of FIG. 1 instead of the arrangement 108, is described below with reference to FIGS. 1 and 6. The arrangement 308 corresponds in its basic design and functionality to the arrangement 208 from FIG. 5, and so only the differences are to be discussed here. In particular, identical components are provided with the identical reference signs, while components of the same type are provided with reference signs increased by the value of 100 (vis-à-vis the second embodiment or 200 vis-à-vis the first embodiment). Unless otherwise stated below, reference is made to the above statements in connection with the first and second exemplary embodiment with regard to the features, functions and advantages of these components.

One difference from the first and second exemplary embodiment consists in the fact that the support unit 304.2 is not inserted into a recess in the mirror M3, but now the support unit 304.2 instead surrounds the mirror M3 from the outside in ring-shaped fashion. Since the second coefficient of thermal expansion CTE2 of the material of the support unit 304.2 is again greater than the first coefficient of thermal expansion CTE1 of the mirror M3, the intermediate space ZR between the support unit 304.2 and the mirror M3 now increases when the temperature of the system increases, which is to say during the transition from the first state Z1 (see continuous contour in FIG. 6) to the second state Z2 (see dashed contour in FIG. 6).

In the present example, the coupling portion 310.3 therefore is configured such that a compensation movement of the second contact portion 310.2 is achieved by the stretching of the arcuate coupling portion 310.3, which to the desired extent compensates or to a desired extent influences (i.e., sets the intermediate space ZR to a desired dimension) the expansion-related distancing of the first contact portion 310.1 from the second contact portion 310.2 (i.e., the increase in the intermediate space ZR between the support unit 304.2 and the mirror M3). To this end, appropriate portions of the coupling portion 310.3 are more strongly aligned in the second direction R2 in the expansion-related increase of the coupling region distance (from KBA1 to KBA2).

Likewise in turn, a desired contact force curve can be set in this example, too, wherein an adjustment device 310.17 may also be provided here to set the contact force FK21. This, too, can be implemented in turn by changing the coupling region distance KBA1 in the first state Z1.

Otherwise, the connection unit 310 can be constructed in a manner analogous to the connection unit 210. In this case, in turn, the connection unit 310 may comprise precisely defined joint sections 310.23 (for example, flexures), via which the kinematics of the arcuate coupling portion 310.3 are precisely defined.

With this connection arrangement 309 described above, too, the methods according to the disclosure can be performed, and so reference is made in this regard to the explanations above.

Fourth Exemplary Embodiment

An embodiment of the arrangement 308 according to the disclosure, which can be used in the imaging device 101 of FIG. 1 instead of the arrangement 108, is described below with reference to FIGS. 1, 7, and 8. The arrangement 408 corresponds in its basic design and functionality to the arrangement 308 from FIG. 6, and so only the differences are to be discussed here. In particular, identical components are provided with the identical reference signs, while components of the same type are provided with reference signs increased by the value of 100 (vis-à-vis the third embodiment or 300 vis-à-vis the first embodiment). Unless otherwise stated below, reference is made to the above statements in connection with the first and third exemplary embodiment with regard to the features, functions and advantages of these components.

One difference from the first and second exemplary embodiment also consists here in the fact that the support unit 304.2 is not inserted into a recess in the mirror M3, but now the support unit 304.2 instead surrounds the mirror M3 from the outside in ring-shaped fashion. Since the second coefficient of thermal expansion CTE2 of the material of the support unit 304.2 is again greater than the first coefficient of thermal expansion CTE1 of the mirror M3, the intermediate space ZR between the support unit 304.2 and the mirror M3 now increases, like in the third exemplary embodiment, when the temperature of the system increases, which is to say during the transition from the first state Z1 (see continuous contour in FIG. 8) to the second state Z2 (see dashed contour in FIG. 8).

In the present example, the first contact portion 410.1 comprises a contact segment 410.11 which, in the assembled state, contacts the first component 304.2 by way of a component contact surface 410.13. In this variant, the contact segment 410.11 forms the first coupling region 410.5 and the second coupling region 410.6 away from the component contact surface 410.13, wherein the coupling portion 410.3, in the assembled state, bridges an intermediate space ZRK between the first coupling region 410.5 and the second coupling region 410.6 once again in arcuate fashion. As already explained above, all that needs to be provided in this context is a free space FR (for example a gap) between the contact segment 410.11 and the coupling portion 410.3, which free space is sufficient for the coupling portion 410.3 to be able to perform the described compensation movement.

In the present example, too, the component contact surface 410.13 of the contact segment 410.11 is spaced apart from the first coupling region 410.5 and the second coupling region 410.6 in the second direction R2. As already explained, this distance can in each case advantageously influence the overall displacement between the first contact portion 410.1 and the second contact portion 410.2 because the thermally induced displacement of the coupling portion 410.3 with respect to the first component 404.2 increases as this distance increases. In the case of a given compensation movement by the coupling portion 410.3, it is then possible to adjust the distance accordingly thereto, in order to obtain a given overall displacement between the first contact portion 410.1 and the second contact portion 410.2.

In general, the contact segment 410.11 can have any desired design. Optionally, the contact segment is designed to be substantially V-shaped or substantially Y-shaped or, like in the present example, substantially T-shaped, since this allows particularly advantageous, in particular compact configurations to be achieved, in which the two coupling regions 410.5, 410.6 can simply be arranged at the free ends of the two limbs.

In the present example of certain variants, the contact segment 410.11, the second contact portion 410.2, and the coupling portion 410.3 form a connection element 410.15, which is of two-part design here, by virtue of the second contact portion 410.2 and the coupling portion 410.3 having a monolithic embodiment. In this case, the second contact portion 410.2 and the coupling portion 410.3 have a lower coefficient of thermal expansion than the contact segment 410.11 in order to achieve the thermally induced compensation movement.

In these designs, too, the connection element 410.15 may be a first connection element and the connection unit 410 may comprise at least one additional connection element 410.15. In this case, the connection unit 410 may comprise M additional connection elements 410.15, where M has the value of 1 to 99, such as 2 to 49, for example 2 to 24. Provision is made of two additional connection elements 410.15 in the present example. Here, too, for the reasons already mentioned above, a different design of the connection elements 410.15 may be provided, for example in order to take account of different load distributions. Likewise, like in the present example, the additional connection elements 410.15 can be designed to be at least substantially identical to the first connection element 410.15.

In these variants, too, the connection elements 410.15 of the connection unit 410 can be arranged in turn as desired, as explained above. In particular, the connection elements 410.15 of the connection unit 410, like in the present example, may be arranged in ring-shaped fashion in order to use the aforementioned advantages of such an arrangement. In certain variants, like in the present example, the connection unit 410 contacts a wall of a recess in the support unit 404.2 (i.e., the first component). In this case, the connection unit 410 is inserted into the recess in the support unit 404.2, which for example can be designed as a support ring to this end. Accordingly, the connection unit 410 in the present example contacts an outer circumference of the mirror M3 (i.e., the second component), wherein the connection unit 410 surrounds the mirror M3 in ring-shaped fashion. The advantages of such a configuration, already explained above, are also achieved herewith.

With this connection arrangement 409 described above, too, the methods according to the disclosure can be performed, and so reference is made in this regard to the explanations above.

The present disclosure has been described above exclusively on the basis of examples from the field of microlithography. However, it is self-evident that the disclosure can also be used in the context of any desired other optical applications, in particular imaging methods at different wavelengths, in which similar problems arise in terms of the deformation for correcting imaging aberrations.

Furthermore, the disclosure can be used in connection with the inspection of objects, such as for example so-called mask inspection, in which the masks used for microlithography are inspected for their integrity, etc. In FIG. 1, a sensor unit, for example, which detects the image representation of the projection pattern of the reticle 104.1 (for further processing), then takes the place of the wafer 105.1. This mask inspection can then take place substantially at the same wavelength as is used in the later microlithographic process. However, it is similarly possible also to use any desired wavelengths deviating therefrom for the inspection.

Finally, the present disclosure has been described above on the basis of specific exemplary embodiments showing specific combinations of the features defined in the following patent claims. It should expressly be pointed out at this juncture that the subject matter of the present disclosure is not restricted to these combinations of features, rather all other combinations of features such as are evident from the following patent claims also belong to the subject matter of the present disclosure.

What is claimed is:

1. A connection arrangement configured to connect first and second components of a microlithographic imaging device, the connection arrangement comprising:
a connection unit, comprising:
a first contact portion comprising first and second coupling regions, the second region being a coupling region distance from the first coupling region in a first direction;
a second contact portion; and
a coupling portion comprising a first end and a second end opposite the first end, wherein:
the first contact portion is configured to contact the first component in an assembled state;
the second contact portion is configured to contact the second component in the assembled state;
at least in the assembled state, the first end of the coupling portion is connected to the first coupling region and the second end of the coupling portion is connected to the second coupling region so that the coupling portion couples the first and second contact portions;
at least in the assembled state, the coupling portion is connected to the first contact portion between the first and second ends;
the first contact portion and/or the coupling portion is configured so that, in the assembled state when a change in state from a first state to a second state with an increase in the coupling region distance, a movement component along a second direction is impressed upon the second contact portion; and
the second direction runs across the first direction.

2. The connection arrangement of claim 1, wherein:
in the assembled state, the connection unit is configured to be in an intermediate space between the first and second components;
the first component has a greater coefficient of thermal expansion than the second component; and
one of the following holds:
i) the intermediate space decreases when the state changes from the first state to a second state and the movement component of the second contact portion in the second direction points at the first component, and the first component is in a recess in the second component; and ii) the intermediate space increases when the state changes from the first state to a second state and the movement component of the second contact portion counter to the second direction points away from the first component, and the second component is in a recess in the first component.

3. The connection arrangement of claim 1, wherein:
the coupling portion defines a center axis between the first and second ends;
at least in the first state, the center axis has an arcuate, first profile between the first and second ends;
in the second state, the center axis of the coupling portion has a second profile, which is stretched compared the first profile between the first and second ends; and
at least one of the following holds:
the second profile is arcuate or at least substantially straight;
the first profile is at least partially curved and/or at least partially polygonal;
the second profile is at least partially curved and/or at least partially polygonal; and
the center axis between the first and second ends defines a first mean curvature in the first state and a second mean curvature in the second state, the second mean curvature being less than the first mean curvature.

4. The connection arrangement of claim 1, wherein:
in the first state, the second contact portion exerts a first contact force on the second component;
in the second state, the second contact portion exerts a second contact force on the second component; and
at least one of the following applies:
i) the first contact portion and/or the coupling portion is configured so that the second contact force is from 80% to 120% of the first contact force;
ii) the first contact portion and/or the coupling portion is configured so that, during the transition from the first state to the second state, the contact force exerted by the second contact portion on the second component varies at most by 15% to 20% of the first contact force; and
iii) the connection unit comprises an adjustment device configured to set the first contact force.

5. The connection arrangement of claim 1, wherein:
the first contact portion is configured so that, when the state changes from the first state to the second state, a coupling region displacement away from the first component counter to the second direction is impressed upon the first coupling region and the second coupling region;
the coupling portion is configured to impress a contact portion displacement upon the second contact portion when the state changes from the first state to the second state; and
the contact portion displacement in the second direction is implemented toward the first component and at least substantially compensates for the effect of the coupling region displacement.

6. The connection arrangement of claim 1, wherein:
the first contact portion comprises first and second contact segments which, in the assembled state, each contact the first component by way of a component contact surface;
the first and second contact segments are spaced apart from one another to define a free space along the first direction;
the first contact segment defines the first coupling region;

the second contact segment defines the second coupling region;

in the assembled state, the coupling portion bridges the free space; and at least one of the following applies:

i) the component contact surface of the first contact segment is spaced from the first coupling region in the second direction; and ii) the component contact surface of the second contact segment is spaced apart from the second coupling region in the second direction.

7. The connection arrangement of claim 6, wherein:

the first contact segment, the second contact segment, and the coupling portion define at least a part of a connection element; and at least one of the following applies:

i) the connection element further comprises the second contact portion; and ii) the connection element is monolithic.

8. The connection arrangement of claim 7, wherein:

the connection element is a first connection element;

the connection unit comprises an additional connection element; and at least one of the following applies:

i) the connection unit comprises N additional connection elements, where N has the value of 1 to 5;

ii) the at least one additional connection element is configured to be at least substantially identical to the first connection element;

iii) at least one contact segment of the first connection element contacts a contact segment of the at least one additional connection element;

iv) at least one contact segment of the first connection element and one contact segment of the at least one additional connection element monolithically formed together;

v) the connection unit is ring-shaped;

vi) the connection unit contacts an outer circumference of the first component, and the connection unit surrounds a portion of the first component in ring-shaped fashion; and vii) the connection unit contacts a wall of a recess in the second component, and the connection unit is in a recess in the second component.

9. The connection arrangement of claim 1, wherein:

the first contact portion comprises a contact segment which, in the assembled state, contacts the first component via a component contact surface;

the contact segment defines the first coupling region and the second coupling region away from the component contact surface;

the coupling portion, in the assembled state, bridges an intermediate space between the first coupling region and the second coupling region; and at least one of the following applies:

i) the component contact surface of the contact segment is spaced apart from the first coupling region and/or the second coupling region in the second direction;

ii) the contact segment is designed to be substantially V-shaped or substantially Y-shaped or substantially T-shaped; and iii) the contact segment and the coupling portion define at least a part of a connection element.

10. The connection arrangement of claim 9, wherein:

the connection element is a first connection element, and the connection unit comprises at least one additional connection element; and at least one of the following applies:

i) the connection unit comprises M additional connection elements, where M has the value of 1 to 99;

ii) the at least one additional connection element is configured to be at least substantially identical to the first connection element;

iii) the connection elements of the connection unit are arranged in ring-shaped fashion;

iv) the connection unit contacts a wall of a recess in the first component; and v) the connection unit contacts an outer circumference of the second component.

11. The connection arrangement of claim 1, wherein:

the first component, at least in its region adjacent to the first contact portion comprises a first material having a first coefficient of thermal expansion;

the second component, at least in its region adjacent to the second contact portion comprises a second material having a second coefficient of thermal expansion;

the connection unit comprises a third material having a third coefficient of thermal expansion; and at least one of the following applies:

i) the first coefficient of thermal expansion is greater than the second and the third coefficient of thermal expansion;

ii) the second coefficient of thermal expansion is greater than the third coefficient of thermal expansion;

iii) the second coefficient of thermal expansion is from 5% to 25% of the first coefficient of thermal expansion;

iv) the third coefficient of thermal expansion is from 5% to 50% of the first coefficient of thermal expansion;

v) the difference between the first coefficient of thermal expansion and the third coefficient of thermal expansion is from 40% to 95% of the difference between the first coefficient of thermal expansion and the second coefficient of thermal expansion;

vi) the first coefficient of thermal expansion is from $10 \cdot 10^{-6} K{-}1$ to $20 \cdot 10^{-6} K{-}1$;

vii) the second coefficient of thermal expansion is from $0.5 \cdot 10^{-6} K{-}1$ to $4 \cdot 10^{-6} K{-}1$; and viii) the third coefficient of thermal expansion is from $2 \cdot 10^{-6} K{-}1$ to $6 \cdot 10^{-6} K{-}1$.

12. The connection arrangement of claim 1, wherein:

at least one of the first contact portion and the second contact portion comprises, in its region adjacent to the first component, a securing portion configured to secure via a form fit the contact portion and the first component in a third direction which runs across the first and the second direction; and at least one of the following applies:

in a third direction, the securing portion is arranged in a central region of the contact portion;

in its region adjacent to the first component, the first contact portion comprises a first securing portion;

in its region adjacent to the second component, the second contact portion comprises a second securing portion;

the securing portion is formed by at least one projection which extends in a plane perpendicular to the third direction and, in the assembled state, engages in an assigned recess in the first component; and in the assembled state, the securing portion is formed by at least one adhesive bond, which is formed in the region of at least one depression in the contact portion.

13. The connection arrangement of claim 1, wherein:

at least one of the first contact portion and the second contact portion comprises, in its region adjacent to the first component, a compensation portion configured to absorb via elastic deformation, a differing thermal expansion between the contact portion and the first component in a third direction which runs across the first and the second direction; and at least one of the following holds:

i) in its region adjacent to the first component, the first contact portion comprises a first compensation portion;

ii) in its region adjacent to the second component, the second contact portion comprises a second compensation portion; and iii) the compensation portion comprises elastic portions spaced from one another along the third direction and a resilience of which along the third direction increases along the third direction from a central portion of the contact portion to the ends of the contact portion, the elastic portions comprising leaf-spring elements a length of which increases toward the ends of the contact portion, the different length of the comprising leaf-spring elements being defined by slots of different depths across the third direction in the contact portion, the depth of the slots increasing along the third direction from the central portion to the ends of the contact portion.

14. The connection arrangement of claim 1, wherein at least one of the following holds:

the first component is a constituent part of a support structure;

the second component comprises an optical element; and the connection unit comprises tungsten or a tungsten alloy.

15. The connection arrangement of claim 1, wherein:

the first component defines an axial direction, a radial direction, and a circumferential direction;

the second direction runs at least substantially along the radial direction; and the first direction runs at least substantially along the circumferential direction, or the first direction runs at least substantially along the axial direction.

16. The connection arrangement of claim 1, wherein:

the second contact portion has a substantially T-shaped or mushroom-shaped cut contour in a plane defined by the first and second directions; and/or the second contact portion has a bridge portion, by which the second contact portion is connected to the coupling portion, a longitudinal axis of the bridge like bridge portion running across the first and second directions.

17. An optical arrangement comprising an optical element connected to a support structure via a connection arrangement according to claim 1.

18. An optical imaging device, comprising:

an illumination device comprising a first optical element group;

an object device to receive an object;

a projection device comprising a second optical element group; and an image device, wherein:

the illumination device is configured to illuminate the object;

the projection device is configured to project an image representation of the object onto the image device;

at least one member selected from the group consisting of the illumination device and the projection device comprise an optical element connected to a support structure via a connection arrangement according to claim 1.

19. A method of connecting a first component and a second component of a microlithographic imaging device via a connection unit, the method comprising:

bringing a first contact portion of the connection unit into contact with the first component in an assembled state;

bringing a second contact portion of the connection unit into contact with the second component in the assembled state;

arranging a first coupling region of the first contact portion and a second coupling region of the first contact portion at a coupling region distance from one another in a first direction;

coupling the first contact portion and the second contact portion together, at least in the assembled state, via a coupling portion of the connection unit comprising a first end and an opposite second end, by virtue of the first end of the coupling portion being connected to the first coupling region and the second end of the coupling portion being connected to the second coupling region; and at least in the assembled state, connecting the coupling portion between the first end and the second end to the second contact portion, wherein:

the first contact portion and/or the coupling portion, in the assembled state when a change in state occurs caused by thermal expansion from a first state to a second state with an increase in the coupling region distance, impresses a movement component along a second direction upon the second contact portion; and the second direction runs across the first direction.

20. The method of claim 19, wherein:

the first component is an optical component of a microlithography illumination device or a microlithography projection device; and the second component is a support component of a microlithography illumination device or a microlithography projection device.

* * * * *